United States Patent
Kutlu

[11] Patent Number: 6,111,313
[45] Date of Patent: Aug. 29, 2000

[54] INTEGRATED CIRCUIT PACKAGE HAVING A STIFFENER DIMENSIONED TO RECEIVE HEAT TRANSFERRED LATERALLY FROM THE INTEGRATED CIRCUIT

[75] Inventor: Zafer S. Kutlu, Sunnyvale, Calif.

[73] Assignee: LSI Logic Corporation, Milpitas, Calif.

[21] Appl. No.: 09/005,491

[22] Filed: Jan. 12, 1998

[51] Int. Cl.[7] .......... H01L 23/48; H01L 23/053; H01L 23/12

[52] U.S. Cl. .......... 257/697; 257/700; 257/706; 257/778; 257/787

[58] Field of Search .................... 257/697, 675, 257/678, 698, 699, 700, 701, 703, 706, 705, 778, 787, 796, 693

[56] References Cited

U.S. PATENT DOCUMENTS

| | | | |
|---|---|---|---|
| 4,744,007 | 5/1988 | Watari et al. | 361/386 |
| 5,217,922 | 6/1993 | Akasaki et al. | 438/108 |
| 5,490,040 | 2/1996 | Gaudenzi et al. | 361/773 |
| 5,563,446 | 10/1996 | Chi et al. | 257/704 |
| 5,629,559 | 5/1997 | Miyahara | 257/666 |
| 5,672,909 | 9/1997 | Glenn et al. | 257/668 |
| 5,773,884 | 6/1998 | Andros et al. | 257/707 |
| 5,834,839 | 11/1998 | Mertol | 257/704 |

FOREIGN PATENT DOCUMENTS

| | | | |
|---|---|---|---|
| 62-249429 | 10/1987 | Japan | 257/705 |
| 3-82144 | 4/1991 | Japan | 257/678 |

*Primary Examiner*—Mahshid Saadat
*Assistant Examiner*—Jhihan B Clark

[57] ABSTRACT

A system and method are presented for forming a grid array device package around an integrated circuit (i.e., chip). The device package includes a substrate, a stiffener, a heat spreader, and an optional heat sink. The chip includes multiple I/O pads arranged upon an underside surface. The substrate includes a first set of bonding pads on an upper surface configured to vertically align with the I/O pads. The chip is connected to the first set of bonding pads using the C4 method. The stiffener, a rigid member able to retain its shape during C4 heating, may be attached to the upper surface of the substrate prior to the C4 process, helping the substrate maintain its planarity during and after the C4 process. The stiffener has an opening dimensioned to receive the chip and exposing the first set of bonding pads. Following the C4 process, a first space between the underside surface of the chip and the upper surface of the substrate is filled with an underfill material. A second space between the side surfaces of the chip and side walls of the opening in the stiffener is filled with an underfill material or a thermal interface material. The underfill or interface material filling the second space provides additional thermal paths for heat energy to flow from the chip to the ambient. The heat spreader is attached to upper surfaces of the stiffener and the chip, and the heat sink is optionally attached to the upper surface of the heat spreader.

16 Claims, 1 Drawing Sheet

INTEGRATED CIRCUIT PACKAGE HAVING A STIFFENER DIMENSIONED TO RECEIVE HEAT TRANSFERRED LATERALLY FROM THE INTEGRATED CIRCUIT

BACKGROUND OF THE INVENTION

1. Field of Invention

This invention relates to integrated circuit packages and, more particularly, to a path of heat transfer in a lateral direction from a periphery of the integrated circuit to a stiffener dimensioned substantially close to the periphery.

2. Description of Related Art

During manufacture of an integrated circuit (e.g., a microprocessor), signal lines formed upon a silicon substrate (i.e., chip) and to be connected to external devices are terminated at flat metal contact regions called input/output (I/O) pads. Following manufacture, the integrated circuit is typically secured within a protective semiconductor device package. Each I/O pad of the chip is then connected to one or more terminals of the device package. The terminals of a device package are typically arranged about the periphery of the package. Fine metal wires are typically used to connect the I/O pads of the chip to the terminals of the device package. Some types of device packages have terminals called "pins" for insertion into holes in a printed circuit board (PCB). Other types of device packages have terminals called "leads" for attachment to flat metal contact regions on an exposed surface of a PCB. Newer ball grid array ("BGA") packages described below have solder balls for attachment to flat metal pads on an exposed surface of a PCB.

As integrated circuit fabrication technology improves, manufacturers are able to integrate more and more functions onto a single silicon chip. As the number of functions on a single chip increases, the number of signal lines which need to be connected to external devices also increase. The corresponding number of required I/O pads and device package terminals increase as well, as do the complexities and costs of the device packages. Constraints of high-volume PCB assembly operations place lower limits on the physical dimensions of device packages and distances between device package terminals. As a result, the areas of peripheral-terminal device packages having hundreds of terminals are largely proportional to the number of terminals. In addition, the lengths of signal lines from chip I/O pads to device package terminals increase with the number of terminals, and the high-frequency electrical performance of larger peripheral-terminal device packages suffer as a result.

The controlled collapse chip connection ("C4") is a well known method of attaching an integrated circuit chip directly to a substrate (e.g., a PCB), and is commonly referred to as the "flip chip" method. In preparation for C4 attachment, the I/O pads of the chip are arranged in a two-dimensional array upon an underside of the chip, and a corresponding set of bonding pads are formed upon an upper surface of the substrate. A solder ball is formed upon each of the I/O pads of the chip. During C4 attachment of the chip to the substrate, the solder balls are placed in physical contact with the bonding pads of the substrate. The solder balls are then heated long enough for the solder to reflow. When the solder cools, the I/O pads of the chip are electrically and mechanically coupled to the bonding pads of the substrate. After the chip is attached to the substrate, the region between the chip and the substrate is filled with an "underfill" material which encapsulates the C4 connections and provides other mechanical advantages.

Like flip chips, grid array semiconductor device packages have terminals arranged in a two-dimensional array across the underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the BGA device package. A BGA device includes a chip mounted upon a larger substrate made of, for example, fiberglass-epoxy printed circuit board material or ceramic material (e.g., aluminum oxide, alumina, $Al_2O_3$, or aluminum nitride, AlN). The substrate includes two sets of bonding pads: a first set adjacent to the chip and a second set arranged in a two-dimensional array across the underside surface of the device package. Members of the second set of bonding pads function as device package terminals. The solder balls on the underside of the BGA device package allow the device to be surface mounted to an ordinary PCB. The I/O pads of the chip are typically connected to corresponding members of the first set of bonding pads by signal lines. The substrate includes one or more layers of signal lines (i.e., interconnects) which connect respective members of the first and second sets of bonding pads. During PCB assembly, the BGA device package is attached to the PCB by reflow of the solder balls just as a flip chip is attached to a substrate.

Semiconductor devices (e.g., integrated circuit chips) dissipate electrical power during operation, transforming electrical energy into heat energy. At the same time, several key operating parameters of a semiconductor device typically vary with temperature, and reliable device operation within specifications occurs only within a defined operating temperature range. For high performance devices, such as microprocessors, specified performance is only achieved when the temperature of the device is below a specified maximum operating temperature. Operation of the device at a temperature above an upper limit of the operating temperature range, or above the maximum operating temperature, may result in irreversible damage to the device. In addition, it has been established that the reliability of a semiconductor device decreases with increasing operating temperature. The heat energy produced by a semiconductor device during operation must thus be removed to the ambient environment at a rate which ensures reliable operation.

The operating temperature of an integrated circuit chip enclosed within a semiconductor device package is governed by: (i) the temperature of the ambient surrounding the device package, (ii) the amount of electrical power dissipated by the chip, and (iii) the sum of thermal resistances of elements and interfaces along a heat transfer path from the chip to the ambient. More complex heat transfer (i.e., cooling) mechanisms, such as heat sinks and forced air cooling, permit semiconductor devices to dissipate more electrical power than direct exposure to the ambient would otherwise allow.

It would be beneficial to have a packaged integrated circuit device including an integrated circuit chip enclosed within a semiconductor device package, wherein the device package includes grid array terminals, and wherein the chip is mounted upon a substrate of the device package using the C4 or flip chip attachment method. The use of C4 attachment would reduce many of the problems associated with using fine metal wires to connect the I/O pads of the chip to corresponding bonding pads of the BGA package, including wire crossover problems and the added electrical inductances of the wires. It would be further desirable to reduce the dimension between the integrated circuit periphery and a cavity inner surface facing the periphery. The cavity inner surface would desirably be formed with a stiffener having a surface which faces the integrated circuit substantially close to the integrated circuit lateral surface to allow heat transfer from the integrated circuit to the stiffener. The addition of a heat transfer path to the stiffener will beneficially improve the overall heat transfer characteristics of the package. Not only will the heat be transferred from the integrated circuit upper and lower surfaces, but the improved configuration also allows heat transfer from the integrated circuit lateral edges. As such, the improved package is best suited for integrated circuits which generate substantial amounts of heat and/or energy.

SUMMARY OF THE INVENTION

The problems outlined above are in large part solved by a system and method for forming a grid array device package around an integrated circuit. The device package includes a substrate, a stiffener, and a heat spreader. The device package may also include an optional heat sink. The integrated circuit includes multiple electrical contacts (i.e., bonding or I/O pads) on an underside surface, preferably arranged in a two-dimensional array. The substrate includes a first set of electrical contacts (i.e., bonding pads) on an upper surface and a second set of bonding pads on an opposed underside surface. The first and second sets of bonding pads are preferably arranged in two-dimensional arrays. The lateral dimensions (i.e., sizes) of the I/O pads of the integrated circuit and members of the first set of bonding pads of the substrate are substantially equal, and the first set of bonding pads of the substrate are configured to vertically align with corresponding members of the I/O pads of the integrated circuit. The substrate also includes multiple layers of a patterned conductive material forming electrical conductors or "traces". The electrical traces connect members of the first and second sets of bonding pads.

The integrated circuit (i.e., chip) is connected to the upper surface of the substrate using the C4 method. During the C4 process, solder bumps covering the I/O pads of the integrated circuit are heated until they reflow, connecting the I/O pads to corresponding members of the first set of bonding pads. The substrate is substantially planar and subject to loss of planarity (i.e., warping) during C4 heating and underfill curing. The stiffener, a substantially rigid member able to retain its shape during C4 heating and underfill curing, may be attached to the upper surface of the substrate prior to the C4 process. The stiffener is dimensioned to substantially cover the upper surface of the substrate. The stiffener has an opening (i.e., a hole) near its center which extends from an upper surface to an opposed underside surface. The hole is dimensioned to receive the integrated circuit in close proximity to the wall which forms the hole (i.e., the circuit-facing wall of the stiffener). According to one embodiment, the spacing between the circuit-facing wall and the outer periphery of the integrated circuit is less than 5.0 mm, and preferably less than 2.0 mm, and more preferably approximately 0.5 mm. The integrated circuit is closely received within the hole of the stiffener such that the first set of bonding pads of the substrate align with respective bonding pads across the integrated circuit.

Following the C4 process, a cavity is formed between the integrated circuit, the stiffener, and the substrate. This cavity between the integrated circuit and substrate, as well as between the integrated circuit and circuit-facing wall of the stiffener, may be filled with an underfill material which is preferably thermally conductive. Alternately, the portion of the cavity between the underside of the integrated circuit and the corresponding portion of the upper surface of the substrate may be filled with the underfill material, and the remaining portion of the cavity between the side surfaces of the integrated circuit and side walls of the hole in the stiffener may be filed with a thermal interface material (e.g., thermal grease). The underfill material encapsulates the C4 solder bump connections and provides other mechanical advantages. The underfill material (or thermal interface material) which brings the side surfaces of the integrated circuit into thermal communication with the stiffener provides additional thermal paths for heat energy to flow from the integrated circuit to the ambient by way of the stiffener and heat spreader or substrate.

The heat spreader is a thermally conductive plate. An underside surface of the heat spreader is attached to the upper surfaces of the stiffener and the integrated circuit following the C4 process. Attached to the entire upper surface of the integrated circuit, the heat spreader efficiently conducts heat energy from the integrated circuit. The optional heat sink is formed from a thermally conductive material (e.g., a metal such as aluminum) and dimensioned to substantially cover an upper surface of the heat spreader. If the heat sink is used, an underside surface of the heat sink may be attached to the upper surface of the heat spreader using a thermally conductive adhesive layer. An upper surface of the heat sink may include fins or pins to increase the amount of surface area in contact with an ambient surrounding the device package.

BRIEF DESCRIPTION OF THE DRAWINGS

Other objects and advantages of the invention will become apparent upon reading the following detailed description and upon reference to the accompanying drawings in which.

Figure 1:
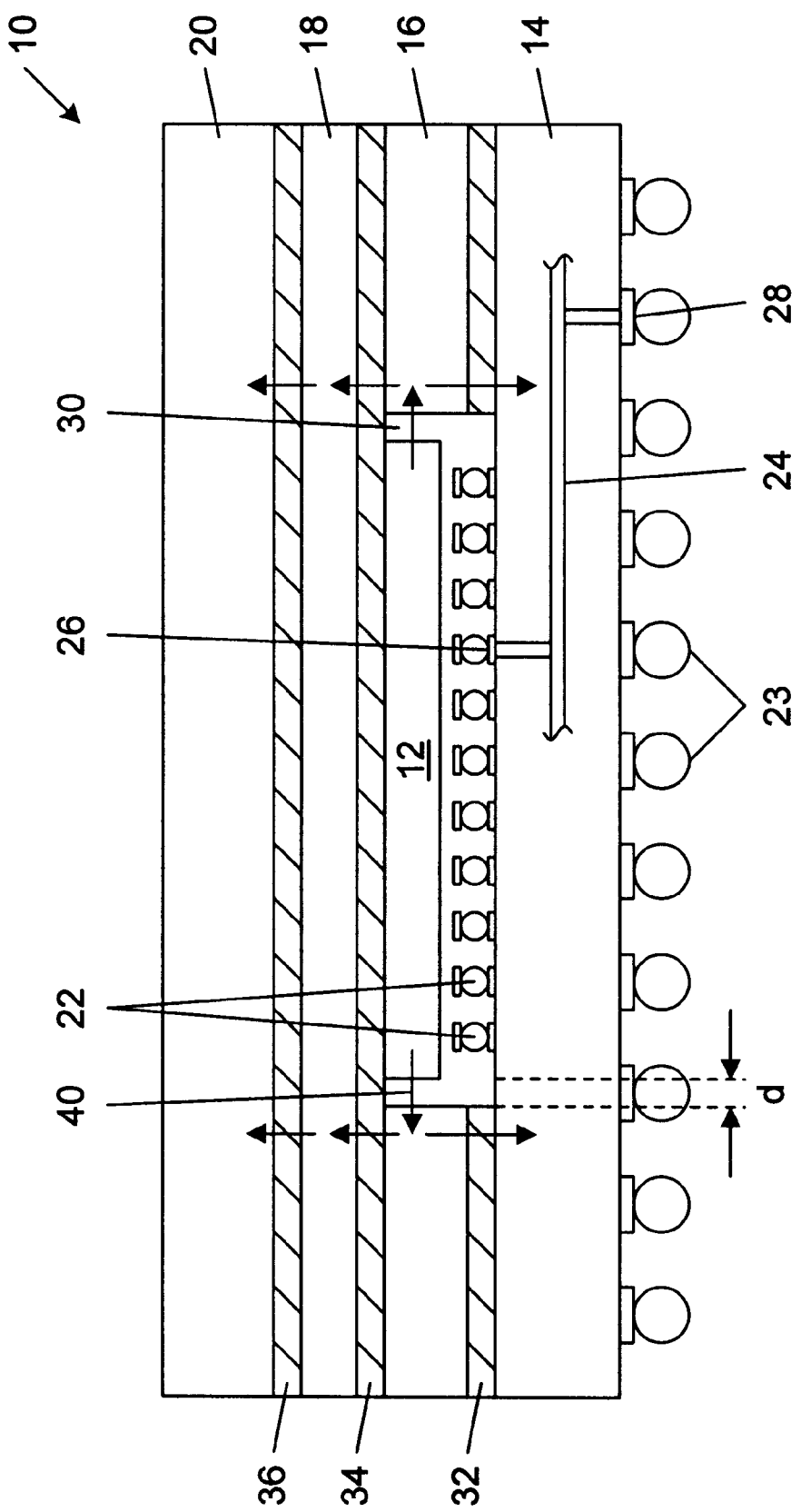
FIG. 1 is a partial cross-sectional view of one embodiment of a grid array package of the present invention, wherein the package may include an integrated circuit (i.e., chip), a substrate, a stiffener, a heat spreader, and an optional heat sink.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a partial cross-sectional view of one embodiment of a semiconductor device 10 employing a grid array device package of the present invention. Semiconductor device 10 includes a monolithic integrated circuit 12 (i.e., chip), a substrate 14, a stiffener 16, a heat spreader 18, and an optional heat sink 20. Chip 12 includes one or more electronic devices formed upon a monolithic semiconductor substrate. Chip 12 also includes multiple I/O pads represented as terminal ends of the integrated circuit conductors. The I/O pads may be arranged near a periphery on an underside surface of chip 12. The I/O pads are preferably arranged in a two-dimensional array across the underside surface and covered with solder, forming solder bumps 22. Substrate 14 is preferably substantially fiberglass-epoxy printed circuit board material. Alternately, substrate 14 may substantially be, for example, a ceramic material (e.g., aluminum oxide or aluminum nitride). Chip 12 is mounted upon substrate 14 using the controlled collapse chip connection (C4) or "flip chip" method described above. Substrate 14 includes two sets of bonding pads; a first set of bonding pads on an upper surface and a second set of bonding pads on an opposed underside surface. The first and second sets of bonding pads are preferably arranged in two-dimensional arrays. Members of the first set of bonding pads have substantially the same lateral dimensions (i.e., are approximately the same size) as the I/O pads of chip 12 and are configured to align with the I/O pads of chip 12. The second set of bonding pads may be covered with solder, forming solder balls 23 as shown in FIG. 1 which function as terminals of semiconductor device 10. Alternately, the second set of bonding pads may have pins extending outwardly therefrom for connecting to a PCB or for inserting into a socket.

Substrate 14 also includes one or more patterned horizontal layers of electrically conductive material forming electrical conductors connecting members of the first and second sets of bonding pads. A layer of the dielectric material of substrate 14 (i.e., fiberglass-epoxy or ceramic material) separates adjacent horizontal conductive layers, electrically isolating the conductive layers. In FIG. 1, an exemplary horizontal trace conductor 24 connects a bonding pad 26 of the first set of bonding pads to a bonding pad 28 of the second set of bonding pads with the help of vertical conductive vias.

Stiffener 16 is a rigid structure made of a thermally conductive material, preferably a metal (e.g., copper, aluminum or an alloy). Stiffener 16 is dimensioned to substantially cover the upper surface of substrate 14. Stiffener 16 includes an opening (i.e., a hole) extending from an upper surface to an underside surface of stiffener 16 substantially in the center of stiffener 16. The hole is bounded by a wall which faces the outer lateral edge of the assembled chip. When stiffener 16 is positioned over the upper surface of substrate 14, the hole exposes the first set of bonding pads of substrate 14. The hole is dimensioned to receive chip 12 in close proximity to the circuit-facing wall. Stiffener 16 may be attached to the upper surface of substrate 14 by an adhesive layer 32 prior to the C4 mounting of chip 12 upon substrate 14. Adhesive layer 32 may be, for example, a layer of an epoxy including particles of a thermally conductive material (e.g., silver, aluminum, boron nitride, etc.). A suitable adhesive material is Abelstik No. 965-1L, a silver-filled epoxy (Abelstik Co., Rancho Dominguez, Calif.).

During the C4 mounting process, heat is applied to solder bumps 22 to cause solder bumps 22 to flow, connecting the I/O pads of chip 12 to corresponding members of the first set of bonding pads on the upper surface of substrate 14. This heat tends to cause substrate 14 to lose planarity (i.e., warp). Stiffener 16 helps keep substrate 14 substantially planar during and after the C4 mounting process. The hole in stiffener 16 is dimensioned such that a spacing d preferably less than 5.0 mm, and more preferably less than 2.0 mm, and most preferably approximately 0.5 mm exists around the perimeter of chip 12 when chip 12 is mounted upon substrate 14. Stiffener 16 retains a substantially planar shape when exposed to maximum C4 temperatures of about 230 degrees Celsius. The vertical thickness of stiffener 16 is selected such that the upper surface of chip 12 is substantially even with or higher than the upper surface of stiffener 16 following C4 mounting of chip 12 to substrate 14.

Following the C4 process, a cavity 30 is formed between chip 12, stiffener 16, and substrate 14. Cavity 30 is bounded by the upper surface of substrate 14 surrounding the first set of bonding pads, the circuit-facing walls of the hole in stiffener 16, the side surfaces of chip 12, and the underside surface of chip 12. Cavity 30 may, according to a preferred embodiment, be substantially filled with an underfill material which is preferably thermally conductive. Cavity 30 is preferably filled after chip 12 is mounted within the hole and before material 34 and heat spreader 18 is added. Alternately, the portion of cavity 30 between the underside of chip 12 and the corresponding portion of the upper surface of substrate 14 may be filled with an underfill material, and the remaining portion of the cavity between the side surfaces of chip 12 and the side walls of the hole in stiffener 16 may be filled with a thermal interface material (e.g., thermally conductive grease).

The C4 underfill material may be, for example, a liquid which becomes substantially rigid (i.e., hardens) during a curing process (e.g., with time and/or elevated temperature). The liquid may be initially dispensed along one or more sides of chip 12, using capillary action to fill the space between the underside of chip 12 and the corresponding portion of the upper surface of substrate 14. For example, the underfill material may be an epoxy compound including suspended particles of a thermally conductive and electrically insulating material (e.g., silica). A suitable adhesive material is Dexter HYSOL® No. 4527, a silica-filled epoxy (Dexter Electronic Materials, Industry, Calif.). The underfill material encapsulates the C4 connections and provides other mechanical advantages. The underfill material (or thermal interface material) which brings the side surfaces of chip 12 into thermal communication with stiffener 16 provides additional thermal paths for heat energy to flow from chip 12 to the ambient via stiffener 16, substrate 14, heat spreader 18, and optional heat sink 20.

The thermally conductive material placed between chip 12 and stiffener 16 provides additional thermal transfer paths. Heat transfer to stiffener 16 is shown as reference numeral 40. Heat path 40 extends to stiffener 16 and thereafter from stiffener 16 to substrate 14 or to heat spreader 18 (or heat sink 20). The addition of heat path 40 enhances the overall heat transfer capability of semiconductor device 10.

Heat spreader 18 is a plate formed from a thermally conductive material (e.g., a metal such as copper). In order to be effective, heat spreader 18 preferably has a vertical thickness of greater than or equal to about 0.5 mm. An underside surface of heat spreader 18 is attached to the upper surfaces of stiffener 16 and chip 12 by an adhesive layer 34. Adhesive layer 34 may be, for example, a layer of a thermally conductive adhesive such as an epoxy compound including particles of a thermally conductive material (e.g., silver, aluminum, boron nitride, etc.). A suitable adhesive material is Abelstik No. 965-1L, a silver-filled epoxy (Abelstik Co., Rancho Dominguez, Calif.). Attached directly to the entire upper surface of chip 12, heat spreader 18 efficiently conducts heat energy from chip 12 either to heat sink 20 or, in the absence of heat sink 20, to an ambient surrounding semiconductor device 10.

Optional heat sink 20 is formed from a thermally conductive material (e.g., a metal such as aluminum). If heat sink 20 is used, an underside surface of heat sink 20 may be attached to the upper surface of heat spreader 18 by an adhesive layer 36. Adhesive layer 36 may be, for example, a layer of a thermally conductive adhesive such as an epoxy compound including particles of a thermally conductive material (e.g., aluminum). Alternately, heat sink 20 may be attached to other members of semiconductor device 10 using fasteners (e.g., clips, screws, etc.), and layer 36 may be a layer of a thermal interface material (e.g., thermal grease). An upper surface of heat sink 20 may be substantially flat, or may include fins or pins to increase the amount of surface area in contact with an ambient surrounding semiconductor device 10.

Numerous variations and modifications will become apparent to those skilled in the art once the above disclosure is fully appreciated. It is intended that the following claims be interpreted to embrace all such variations and modifications.

What is claimed is:

1. A package intended for housing an integrated circuit, comprising:

a substrate comprising a surface on which a plurality of dielectrically spaced conductors terminate as contacts, wherein said contacts are aligned directly below a respective plurality of bonding pads arranged on one surface of the integrated circuit;

a substantially rigid member coupled to said surface and having an opening through the member to expose said contacts; and a wall of said rigid member which encompasses the opening is adapted to be configured substantially close to a periphery of the integrated circuit to allow heat transfer from the integrated circuit to said rigid member.

2. The package as recited in claim 1, wherein said contacts and bonding pads are connected to retain said integrated circuit upon said substrate, and wherein said bonding pads are laterally dimensioned along the surface of said integrated circuit at substantially the same dimension as the contacts laterally dimensioned along the surface of said substrate.

3. The package as recited in claim 1, wherein said rigid member retains a substantially planar shape when exposed to maximum thermal energy of about 230 degrees C.

4. The package as recited in claim 1, further comprising a thermally conductive material deposited in liquid form between said wall and the periphery of the integrated circuit to effectuate heat transfer.

5. The package as recited in claim 1, further comprising an underfill material between said integrated circuit and said substrate.

6. The package as recited in claim 1, further comprising a thermally conductive material between said wall and the periphery of the integrated circuit to effectuate heat transfer.

7. An assembly, comprising:

a substrate embodying a plurality of electrically conductive contacts extending to a surface of said substrate;

an integrated circuit having bonding pads arranged in coupled alignment with said contacts;

a stiffener comprising an opening surrounded by a stiffener wall which faces said integrated circuit within a 0.5 mm to 5.0 mm of a lateral edge of said integrated circuit; and a thermally conductive material arranged between said stiffener wall and the lateral edge of said integrated circuit.

8. The assembly as recited in claim 7, wherein said thermally conductive material is deposited in liquid form between said stiffener wall and the lateral edge of said integrated circuit.

9. The assembly as recited in claim 7, wherein said stiffener wall faces said integrated circuit within 0.5 mm to 5.0 mm of a lateral edge of said integrated circuit.

10. The assembly as recited in claim 7, wherein an upper elevational extent of said stiffener wall is lower than or substantially equal to an upper elevational extent of the lateral edge of said integrated circuit.

11. The assembly as recited in claim 7, wherein said stiffener comprises an upper surface elevationally lower than or coplanar with a surface of the integrated circuit opposite the surface on which said bonding pads are arranged.

12. The assembly as recited in claim 8, wherein said thermally conductive material comprises an underfill material.

13. The assembly as recited in claim 8, wherein said thermally conductive material comprises thermally conductive grease.

14. The assembly as recited in claim 11, wherein said upper surface is adapted to receive a heat dissipation mechanism thermally coupled thereto.

15. The assembly as recited in claim 14, wherein said heat dissipation mechanism comprises a heat spreader.

16. The assembly as recited in claim 14, wherein said heat dissipation mechanism comprises a heat sink layered upon a heat spreader.

* * * * *